United States Patent
Chang et al.

(10) Patent No.: US 7,375,660 B1
(45) Date of Patent: May 20, 2008

(54) HUFFMAN DECODING METHOD

(75) Inventors: Wen-Tsung Chang, Taipei (TW); Che-Sheng Chuang, Taipei (TW)

(73) Assignee: Primax Electronics Ltd., Taipei (TW)

( * ) Notice: Subject to any disclaimer, the term of this patent is extended or adjusted under 35 U.S.C. 154(b) by 0 days.

(21) Appl. No.: 11/673,379

(22) Filed: Feb. 9, 2007

(30) Foreign Application Priority Data

Nov. 24, 2006 (TW) ................ 95143505 A

(51) Int. Cl.
*H03M 7/40* (2006.01)
(52) U.S. Cl. .................... 341/65; 341/67; 382/246
(58) Field of Classification Search .............. 341/65, 341/67; 382/246
See application file for complete search history.

(56) References Cited

U.S. PATENT DOCUMENTS

| | | | | |
|---|---|---|---|---|
| 4,899,149 A | * | 2/1990 | Kahan | 341/67 |
| 6,563,439 B1 | * | 5/2003 | Acharya et al. | 341/65 |
| 6,636,167 B1 | * | 10/2003 | Acharya et al. | 341/65 |
| 6,646,577 B2 | * | 11/2003 | Acharya et al. | 341/67 |
| 7,190,287 B2 | * | 3/2007 | Acharya et al. | 341/65 |
| 7,205,915 B2 | * | 4/2007 | Zheltov et al. | 341/67 |

* cited by examiner

*Primary Examiner*—Khai M Nguyen
(74) *Attorney, Agent, or Firm*—Kirton & McConkie; Evan R. Witt

(57) ABSTRACT

The present invention relates to a Huffman decoding method. Firstly, a Huffman table including multiple Huffman codes and multiple corresponding size/symbol codes is extracted. Each Huffman code comprises a codeword and each size/symbol code comprises a size code and a symbol code. Then, multiple mask codes are generated according to the size codes. Then, masking operations are performed on successive 16 bits of the compression bit stream and the mask codes, thereby outputting multiple masking results. Subsequently, logic operations on the masking results and the Huffman codes, thereby generating multiple are performed on the new Huffman codes, wherein each new Huffman code includes the codeword. It is discriminated whether the 16 bits of the compression bit stream complies with a specific one of new Huffman codes, thereby outputting the size/symbol code corresponding to the codeword.

8 Claims, 5 Drawing Sheets

| Address | Symbol | Size | Codeword |
|---------|--------|------|----------|
| 0 | "A" | 1 | 1 |
| 1 | "B" | 2 | 00 |
| 2 | "C" | 3 | 010 |
| 3 | "D" | 5 | 01111 |
| 4 | "E" | 5 | 01100 |
| 5 | "F" | 6 | 011101 |
| 6 | "G" | 7 | 0111001 |
| 7 | "H" | 7 | 0111000 |
| 8 | "I" | 7 | 0110111 |
| 9 | "J" | 7 | 0110110 |
| 10 | "K" | 7 | 0110101 |
| 11 | "L" | 7 | 0110100 |

(Binary system)

FIG.1
PRIOR ART

| Address | Symbol | Size | Huffman code |
|---|---|---|---|
| 0 | "A" | 1 | 1000000000000000 |
| 1 | "B" | 2 | 0000000000000000 |
| 2 | "C" | 3 | 0100000000000000 |
| 3 | "D" | 5 | 0111100000000000 |
| 4 | "E" | 5 | 0110000000000000 |
| 5 | "F" | 6 | 0111010000000000 |
| 6 | "G" | 7 | 0111001000000000 |
| 7 | "H" | 7 | 0111000000000000 |
| 8 | "I" | 7 | 0110111000000000 |
| 9 | "J" | 7 | 0110110000000000 |
| 10 | "K" | 7 | 0110101000000000 |
| 11 | "L" | 7 | 0110100000000000 |

(Binary system)

HUFFMAN DECODING METHOD

FIELD OF THE INVENTION

The present invention relates to a decoding method, and more particularly to a Huffman decoding method.

BACKGROUND OF THE INVENTION

Huffman encoding algorithm is widely used in compression of video and image data, for example in JPEG and MPEG compression. As known, identical symbols (e.g. A, B, C, etc.) included in a file to be compressed may be repeatedly occurred. Based on the frequency of occurrence of the symbols in the file that is being compressed, Huffman encoding algorithm encodes symbols by assigning thereto respective codewords having lengths corresponding to probabilities of occurrence of the symbols. In a case that the occurrence of a symbol is more frequent, the length of the encoded symbol is shorter. Take a file having data ABCB-CDCDDD for example. The frequency of occurrence for the symbol A is 1, for the symbol B is 2, for the symbol C is 3 and for the symbol D is 4. Since the symbol D has the most probable occurrence, the symbol D is assigned with a codeword having the shortest code length or bit-size. In contrast, since the symbol A has the least probable occurrence, the symbol A is assigned with a codeword having the longest code length or bit-size. For example, the symbol A is assigned with a codeword "11111111", the symbol B is assigned with a codeword "00000", the symbol C is assigned with a codeword "111" and the symbol D is assigned with a codeword "00". By assigning smaller codes to more frequently used symbols and larger codes for less frequently used symbols, Huffman compression is a variable-length encoding system of reducing the size of files being compressed.

For reading the contents of the original file, the compressed file should be decompressed and then decoded by using a Huffman table as shown in FIG. 1. Referring to FIG. 1, the Huffman table includes several columns such as an address column, a symbol column, a size column and a codeword column. The address column denotes the address of the codeword stored in the memory. The size column denotes the bit-size of the codeword. The codeword column denotes the Huffman code of the encoded symbol. For example, the symbol J shown in FIG. 1 is assigned with a codeword "0110110" having a bit size of 7 (i.e. 7 bits). In other words, the input data "0110110" are encoded by the Huffman decoder into a corresponding symbol J and the bit-size is 7.

Nowadays, a nice way of visualizing the process of decoding a file compressed with Huffman encoding is to use a binary tree. A Huffman decoding method of using a binary tree-based search was disclosed in U.S. Pat. No. 6,621,429. According to the binary tree-based search, the Huffman table describes a binary tree corresponding to the Huffman code. Starting from the uppermost node, each node has two branches connected thereto so as to construct the binary tree.

Please refer to FIG. 2, which is a schematic view showing a binary tree created from the Huffman table of FIG. 1. Generally, if the Huffman table is changed, the configurations of the binary tree are varied. The binary tree of FIG. 2 stores each data (symbol) in a corresponding leaf node. By a Huffman decoder, a symbol search begins at the root of a binary tree and ends at any of the leaves. One bit for each node is extracted from bit-stream while traversing the binary tree. The code for a symbol is obtained by following the path from the root to the leaf node containing that symbol. The low-level bit 0 of the input data is assigned to a left branch, and the high-level bit 1 is assigned to a right branch. After a symbol corresponding to the bit is searched, a next bit of the input data is extracted and then decoded as described above.

For example, an input data stream "011101" to be decoded is illustrated with reference to FIG. 2. As to the node 11, the first bit data "0" is assigned to the left branch to the node 12. As to the node 12, the second bit data "1" is assigned to the right branch to the node 13. As to the node 13, the third bit data "1" is assigned to the right branch to the node 14. As to the node 14, the fourth bit data "1" is assigned to the right branch to the node 19. As to the node 19, the fifth bit data "0" is assigned to the left branch to the node 20. As to the node 20, the sixth bit data "1" is assigned to the right branch to the leaf node storing that symbol F. That is, the input data stream "011101" may be decoded into the symbol F. After the leaf node is searched, a new input data stream is continuously read and a symbol search begins at the root node 11 again. The binary tree search procedures are repeated until all input data streams are recoded.

Since the bits of the input data stream are decoded one by one, the processing speed of such binary tree search method is very slow and is not suitable to decode abundant compressed files. Therefore, there is a need to provide a Huffman decoding method for decoding Huffman codes at a high speed.

SUMMARY OF THE INVENTION

It is an object of the present invention to provide a Huffman decoding method capable of decoding Huffman codes at a high speed.

In accordance with a first aspect of the present invention, there is provided a Huffman decoding method for decoding a compression bit stream into corresponding size/symbol codes. Firstly, a Huffman table including multiple Huffman codes and multiple corresponding size/symbol codes is extracted. Each Huffman code includes a codeword having variable code length and each size/symbol code includes a size code and a symbol code. Then, multiple mask codes are generated according to the size codes. Then, masking operations are performed on successive 16 bits of the compression bit stream and the mask codes, thereby outputting multiple masking results. Subsequently, logic operations are performed on the masking results and the Huffman codes, thereby generating multiple the new Huffman codes, wherein each new Huffman code includes the codeword. It is discriminated whether the 16 bits of the compression bit stream complies with a specific one of new Huffman codes, thereby outputting the size/symbol code corresponding to the codeword.

In an embodiment, each mask code is composed of 16 binary codes and includes a valid bit portion and an invalid bit portion, wherein the bit-size of the valid bit portion of the mask code is determined according to the size code.

In an embodiment, an AND gate and an OR gate are used for performing the masking operation and the logic operation, respectively, when the bit "0" indicates a valid bit and the bit "1" indicates an invalid bit.

In an embodiment, an OR gate and an AND gate are used for performing the masking operation and the logic operation, respectively, when the bit "1" indicates a valid bit and the bit "0" indicates an invalid bit.

In accordance with a second aspect of the present invention, there is provided a Huffman decoding device for decoding a compression bit stream into corresponding size/symbol codes. The Huffman decoding device comprises a Huffman table extracting and processing unit, a Huffman memory, a symbol and size code memory, a mask memory, a compression bit stream processing unit, a Huffman code processing unit and a Huffman decoding unit. The Huffman table extracting and processing unit is used for extracting a Huffman table and generating multiple mask codes. The Huffman table includes multiple Huffman codes and multiple corresponding size/symbol codes. Each Huffman code includes a codeword having variable code length, each size/symbol code includes a size code and a symbol code, and the mask codes are generated according to the size codes. The Huffman memory is electrically connected to the Huffman table extracting and processing unit for storing the Huffman codes therein. The symbol and size code memory is electrically connected to the Huffman table extracting and processing unit for storing the size/symbol codes therein. The mask memory is electrically connected to the Huffman table extracting and processing unit for storing the mask codes therein. The compression bit stream processing unit is electrically connected to the mask memory and performing masking operations on successive 16 bits of the compression bit stream and the mask codes, thereby outputting multiple masking results. The Huffman code processing unit is communicated with the Huffman table extracting and processing unit for performing logic operations on the masking results and the Huffman codes, thereby generating multiple new Huffman codes, wherein each new Huffman code includes the codeword. The Huffman decoding unit is communicated with the Huffman table extracting and processing unit for discriminating whether the 16 bits of the compression bit stream complies with a specific one of new Huffman codes, thereby outputting the size/symbol code corresponding to the specific new Huffman code.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 1 schematically illustrates a conventional Huffman table;

DETAILED DESCRIPTION OF THE PREFERRED EMBODIMENT

The present invention relates to a Huffman decoding method. First of all, a Huffman table is provided in a Huffman decoder to describe the Huffman codes. Take a JPEG file for example. Generally, a standard JPEG Huffman table has been previously provided in the decoder. The standard JPEG Huffman table includes codewords for most JPEG files in order to be used for decoding most compressed JPEG data. On the other hand, the application of the standard JPEG Huffman table is restricted because some JPEG files have specific decompression requirements. As a consequence, the manufacture may design specified Huffman tables as required. These specified Huffman table are stored in the header of the JPEG file. When the decoding operation is initiated, the specified Huffman tables will be downloaded from the JPEG file to the decoder through the bus.

Figure 2:
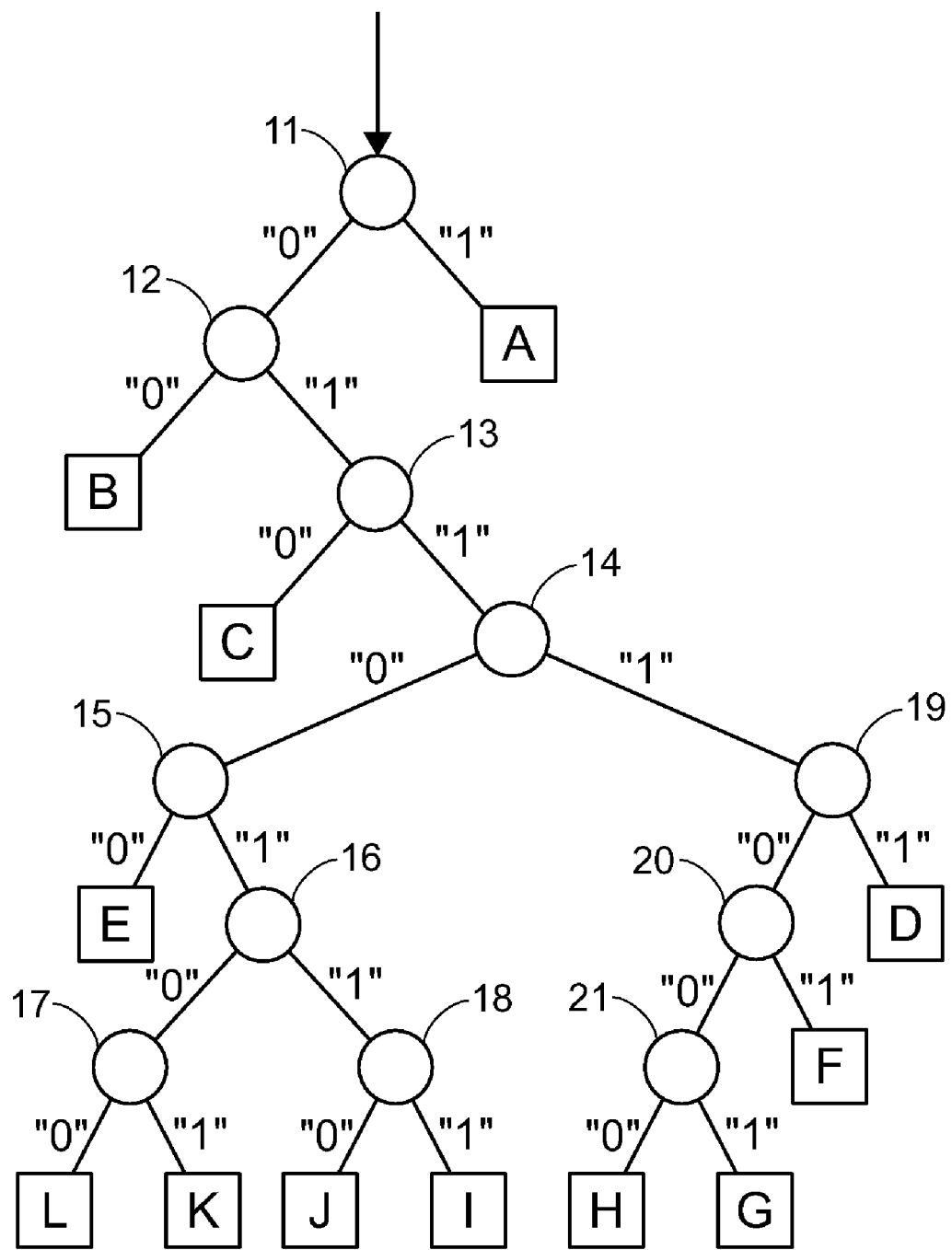
FIG. 2 is a schematic view showing a binary tree created from the Huffman table of FIG. 1.
Figures 3A, 3B:
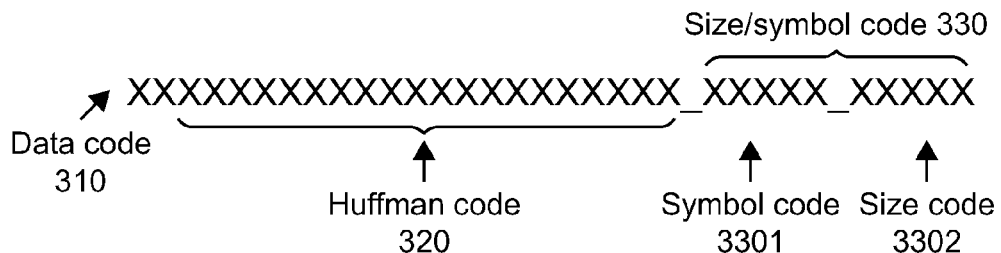
FIG. 3(a) schematically illustrates a data code definition for the Huffman table used in the present invention.
FIG. 3(b) schematically illustrates a Huffman table used in the present invention.

Referring to FIG. 3(a), a data code definition for the Huffman table used in the present invention is illustrated. The data code 310 is a 32-bit code. The first two bits of the data code 310 denote chroma value, luma value, AC coefficient and DC coefficient. The next twenty bits indicate the Huffman code 320. Each Huffman code 320 includes a codeword having variable code length. The next five bits denotes a symbol code 3301. The five bits subsequent to the symbol code 3301 is a size code 3302. In this embodiment, the symbol code 3301 and the size code 3302 are cooperatively referred as a size/symbol code 330. In this embodiment, the Huffman code 320 is illustrated by referring to a 16-bit code because the 16-bit Huffman code is commonly used. Nevertheless, the Huffman code 320 of the present invention can be expanded to 20 bits in order to decode higher-bit Huffman code and increase the application spectrum.

Referring to FIG. 3(b), an embodiment of a Huffman table used in the present invention is illustrated. As shown in FIG. 3(b), the Huffman table includes several columns such as an address column, a symbol column, a size column and a Huffman code column. The meanings of the address column, the symbol column and the size column are identical to those described in FIG. 1, and are not described redundantly herein. As previously described, the codeword column in the conventional Huffman table denotes the Huffman code of the encoded symbol. Instead of the codeword column, the preceding one or more bits of the Huffman code shown in the Huffman code column of FIG. 3(b) denotes the codeword. In other words, the codeword having variable code length is included in the 16-bit Huffman code. As a consequence, the Huffman decoder may perform the decoding operations regardless of whether the exact code length of the codeword is realized. In addition, the size code denotes bit-size of the codeword and is measure of deciding the mask code. The mask code includes a valid bit portion and an invalid bit portion. The bit-size of the valid bit portion of the mask code is determined according to the size code. In this embodiment, the Huffman code includes the codeword and the valid bit portion of the mask code. The low-level bit "0" is assigned to the valid bit portion and the high-level bit "1" is assigned to the invalid bit portion. For example, the symbol A at the address "0" has a size code "1" and is assigned with a codeword "1", the Huffman code is "1000, 0000,0000,0000", which includes the size code "1" and the remainder 15 valid bits "0". Whereas, if the high-level bit "1" is assigned to the valid bit portion and the low-level bit "0" is assigned to the invalid bit portion, the Huffman code of the symbol A is "1111, 1111, 1111, 111" which includes the size code "1" and the remainder 15 valid bits "1".

Figure 3C:
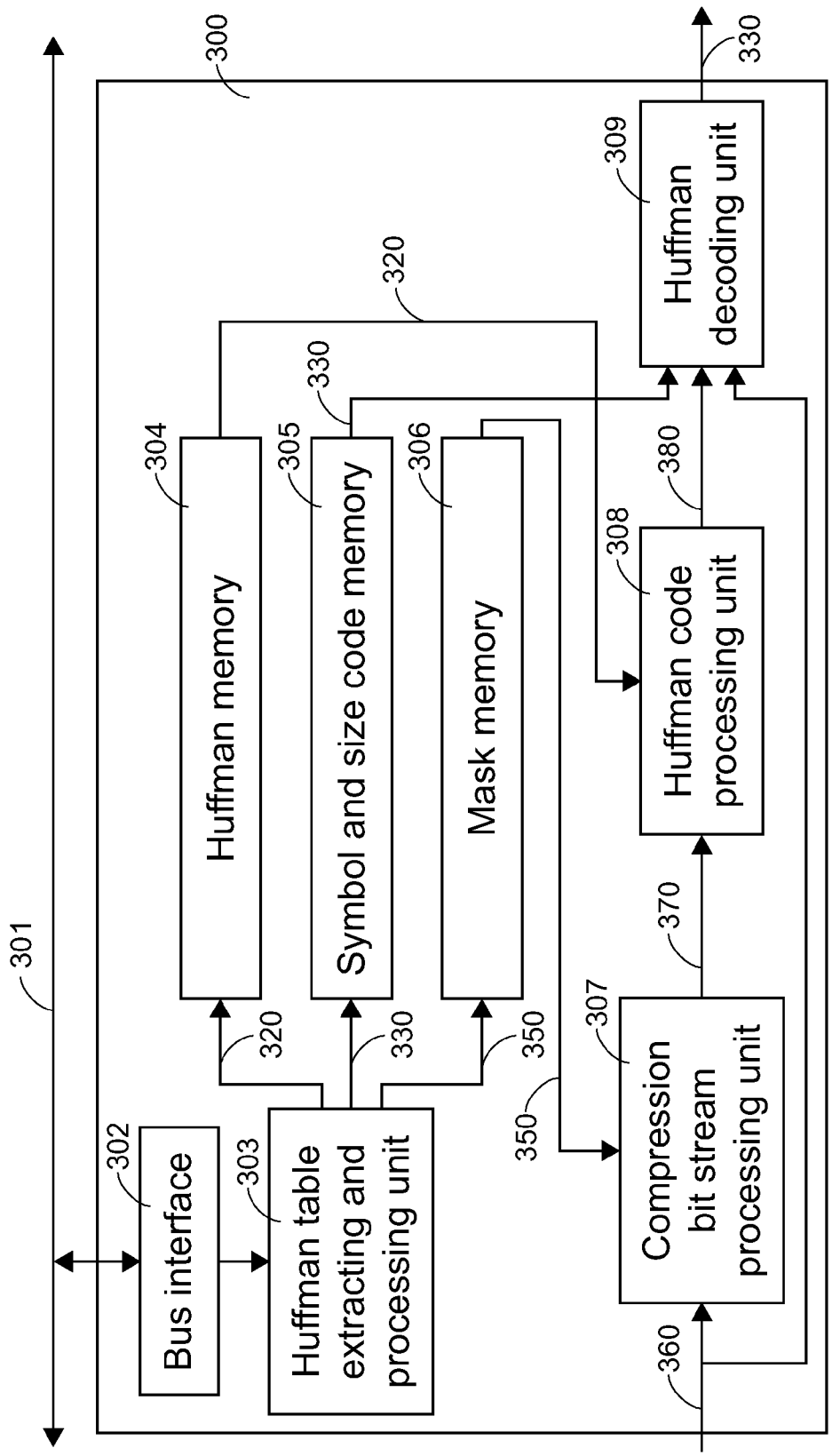
FIG. 3(c) is a schematic circuit block diagram of a Huffman decoding device according to a first preferred embodiment of the present invention.

Referring to FIG. 3(c), a schematic circuit block diagram of a Huffman decoding device according to a first preferred embodiment of the present invention is illustrated. The Huffman decoding device 300 is electrically connected to a bus 301. Via the bus 301, the data code 310 stored in the header of a compressed file (e.g. a JPEG file) may be transmitted to the Huffman decoding device 300, so that the data code 310 is obtained by the Huffman decoding device 300. As shown in FIG. 3(c), the Huffman decoding device 300 includes a bus interface 302, a Huffman table extracting and processing unit 303, a Huffman memory 304, a symbol and size code memory 305, a mask memory 306, a compression bit stream processing unit 307, a Huffman code processing unit 308 and a Huffman decoding unit 309.

The Huffman decoding device 300 is communicated with the bus 301 through the bus interface 302 so as to receive the data code 310. The data code 310 is processed by the Huffman table extracting and processing unit 303 and classified into a Huffman code 320, a symbol code 3301 and a size code 3302, in which the symbol code 3301 and the size code 3302 are cooperatively referred as a size/symbol code 330. According to the size code 3302, a mask code 350 is generated. The Huffman code 320 is stored in the Huffman memory 304. The size/symbol code 330 is stored in the symbol and size code memory 305. The mask code 350 is stored in the mask memory 306. The compression bit stream processing unit 307 is employed to receive the compression bit stream 360 to be decoded. In response to the mask code 350, the compression bit stream processing unit 307 performs a masking operation on the compression bit stream 360, thereby outputting a masking result 370. By the Huffman code processing unit 308, a logic operation is performed on the masking result 370 and the Huffman code 320, thereby generating a new Huffman code 380. In response to the new Huffman code 380, the compression bit stream 360 is decoded by the Huffman decoding unit 309.

Hereinafter, the operation principle of the circuit block diagram of FIG. 3(c) will be illustrated as follows.

First of all, the compressed file to be decoded is transmitted to the Huffman decoding device 300 via the bus 301. In this embodiment, the compressed file to be decoded includes for example the compression bit stream 360 and the data code 310. Multiple data codes 310 are transmitted to the Huffman table extracting and processing unit 303 through the bus interface 302.

Subsequently, as shown in FIG. 3(c), the multiple data codes 310 are processed by the Huffman table extracting and processing unit 303 and thus classified into Huffman codes 320, symbol codes 3301 and size codes 3302. According to the size codes 3302, corresponding mask codes 350 are generated. Each mask code 350 includes a valid bit portion and an invalid bit portion. The bit-size of the valid bit portion of the mask code 350 is determined according to the size code 3302. Next, the Huffman codes 320, the size/symbol codes 330 and the mask codes 350 are stored in the Huffman memory 304, the symbol and size code memory 305 and the mask memory 306, respectively. Then, 16 bits of a compression bit stream 360 are successively inputted into the compression bit stream processing unit 307, and the mask codes 350 are issued from the mask memory 306 to the bit stream processing unit 307. The compression bit stream processing unit 307 may perform a masking operation on the 16-bit compression bit stream 360 and the mask code 350, thereby outputting a masking result 370.

The Huffman code processing unit 308 receives the Huffman codes 320 from the Huffman memory 304, and then performs a logic operation on the Huffman codes 320 and the masking result 370, thereby generating a new Huffman code 380. The new Huffman code 380 also includes a codeword having variable code length.

The Huffman decoding unit 309 receives the size/symbol codes 330 from the symbol and size code memory 305 and successively receives the 16 bits of the compression bit stream 360. By means of the Huffman decoding unit 309, the 16-bit compression bit stream 360 is compared with the new Huffman code 380. When the 16-bit compression bit stream 360 complies with the new Huffman code 380, the Huffman decoding unit 309 will output the corresponding size/symbol codes 330. Under this circumstance, the codeword of the Huffman codes 320 is identical to the codeword of the new Huffman code 380.

An implementation example of the present invention will be illustrated with reference to the Huffman table of FIG. 3(b) and the circuit block diagram of FIG. 3(c).

In the present description, the compression bit stream indicates a stream of input data having a codeword. The term "decoded" used herein means that the size and the symbol on the Huffman table corresponding to the codeword of the compression bit stream are read out. As previously described, the codeword using in the conventional encoding system have variable code length. For example, in a case that nine bits of a stream of input data are successively received, the first bit may indicate a first codeword having a size of 1, the second to sixth bits may indicate a second codeword having a size of 5, and the seventh to ninth bits may indicate a third codeword having a size of 3. Since the conventional Huffman decoder fails to identify which bits of the input data stream indicate a complete codeword, the bits of the input data stream need to be decoded one by one according to the conventional binary tree search technique.

By means of the Huffman decoding device 300 of the present invention, 16 bits of the compression bit stream 360 are decoded at one time and thus the decoding speed is enhanced. The 16-bit compression bit stream 360 may be simultaneously compared with multiple Huffman codes included in the Huffman table. After the comparison, the size/symbol code corresponding to a first codeword of the compression bit stream is decoded.

Hereinafter, a procedure of comparing the compression bit stream with the Huffman table will be illustrated as follows.

Firstly, the preceding 16 bits of a compression bit stream 360 (e.g. "1010,1010,1010,1010") are successively inputted. Then, the input data stream "1010,1010,1010,1010" is compared with the 12 Huffman codes included in the Huffman table so as to obtain the corresponding Huffman code.

For example, the symbol A at the address "0" has a size code "1" and a Huffman code "1000,0000,0000,0000". According to the size code, a corresponding 16-bit mask code is generated. The mask code includes a valid bit portion and an invalid bit portion, and the bit-size of the valid bit portion of the mask code is determined according to the size code. In the size code, the first bit and the remainder 15 bits of the 16-bit mask code belong to the valid portion and invalid portion, respectively. If the bit "0" indicates a valid bit and the bit "1" indicates an invalid bit, the obtained mask code is "0111,1111,1111,1111". Whereas, if the bit "1" indicates a valid bit and the bit "0" indicates an invalid bit, the obtained mask code is 1000,0000,0000,0000". The rest may be deduced by analogy. In the embodiment, the size code 3302 indicates the bit-size of the codeword included in the Huffman code 320 and the mask code 350 is determined according to the size code 3302. Since the Huffman code "1000,0000,0000,0000" has a size code "1", the first bit "1" of this Huffman code 320 denotes the corresponding codeword.

Next, the compression bit stream processing unit 307 performs a masking operation on the mask code 350 ("0111, 1111,1111,1111") and the 16-bit compression bit stream 360 ("1010,1010,1010,1010"), thereby outputting a masking result 370. The term "masking operation" used herein indicates that the 16-bit mask code and the 16-bit compression bit stream are operated by an AND gate or an OR gate. In a case that the bit "0" indicates a valid bit and the bit "1" indicates an invalid bit, the AND gate is selected for performing the masking operation. Whereas, in a case that the bit "1" indicates a valid bit and the bit "0" indicates an invalid bit, the OR gate is selected for performing the masking operation. In this embodiment, the AND gate is selected for performing the masking operation, and the obtained masking result 370 is "0010,1010,1010,1010".

Next, the Huffman code processing unit 308 receives the Huffman codes 320 ("1000,0000,0000,0000") from the Huffman memory 304, and performs a logic operation on the Huffman codes 320 ("0010,1010,1010,1010") and the masking result 370 ("0010,1010,1010,1010"). The term "logic operation" used herein indicates that the 16-bit Huffman code 320 and the 16-bit masking result 370 are operated by an AND gate or an OR gate. In a case that the bit "0" indicates a valid bit and the bit "1" indicates an invalid bit, the OR gate is selected for performing the logic operation. Whereas, in a case that the bit "1" indicates a valid bit and the bit "0" indicates an invalid bit, the AND gate is selected for performing the logic operation. In this embodiment, the OR gate is selected for performing the logic operation, thereby generating a new Huffman code 380 (i.e. "1010, 1010,1010,1010"). The new Huffman code 380 also includes a codeword "1".

By means of the Huffman decoding unit 309, the new Huffman code 380 ("1010,1010,1010,1010") is compared with the 16-bit compression bit stream 360 ("1010,1010, 1010,1010"). Since the 16-bit compression bit stream 360 complies with the new Huffman code 380, the Huffman decoding unit 309 will output the corresponding size/symbol code 330. In this embodiment, since the first bit of the input data stream denotes the codeword at the address "0", the size/symbol code of 1/A will be read out.

The procedures of comparing the compression bit stream with the other 11 Huffman codes included in the Huffman table are identical to that described above. Since the Huffman table has been established by encoding all possible compression bit streams, every 16-bit compression bit stream will correspond to a Huffman code at a specific address. In the above embodiment, the first bit of the input data stream denotes the codeword of the Huffman code at the address "0". Since one size/symbol code at the address "0" has been decoded, the Huffman codes at other addresses are impossible to match the input data stream.

Since the first bit of the 16-bit compression bit stream has been decoded, the Huffman decoding device 300 will receive an addition bit in order that the next compression bit stream still has 16 bits.

The above embodiment is illustrated by referring to one Huffman code processing procedure. Nevertheless, the Huffman decoding method of the present invention can be applied to process multiple Huffman codes so as to obtain multiple new Huffman codes. Therefore, the successive 16 bits of the compression bit stream may be simultaneously compared with multiple Huffman codes.

Hereinafter, a procedure of simultaneously comparing the compression bit stream with 12 Huffman codes in the Huffman table of FIG. 3(b) will be illustrated as follows.

Firstly, the 16 bits of a compression bit stream 360 (e.g. "1010,1010,1010,1010") are successively inputted. Then, the 12 Huffman codes included in the Huffman table are processed as described above, thereby obtaining 12 new Huffman codes, "1010,1010,1010,1010", "0010,1010,1010, 1010", . . . , and so on. Since the first new Huffman code complies with the compression bit stream 360, the size/symbol code of 1/A will be read out. Meanwhile, since the first bit of the compression bit stream 360 has been decoded, the codeword having a bit size of 1 is removed and the remaindering input data stream includes 15 bits, i.e. "0101, 0101,0101,010". For maintaining 16 bits, an additional bit, e.g. "0", is supplemented such that a next input data stream "0101,0101,0101,0100" is intended to be further decoded. Generally, one or additional bits to be supplemented are determined according to the existing bits of the compression bit stream 360.

After the new input data stream "0101,0101,0101,0100" is received, the 12 Huffman codes included in the Huffman table are processed as described above, thereby obtaining 12 new Huffman codes. The first new Huffman code is "1101, 0101,0101,0100", the second Huffman code is "0001,0101, 0101,0100". The third Huffman code is "0101,0101,0101, 0100". The fourth Huffman code is "0111,1101,0101,0100". The fifth Huffman code is "0101,0101,0101,0100". The rest may be deduced by analogy. Next, the new input data stream "0101,0101,0101,0100" is successively compared with the 12 new Huffman codes. The data matching result shows that the first new Huffman code and the second new Huffman code do not comply with the new input data stream, but the third Huffman code complies with the new input data stream. Meanwhile, the size/symbol code of 5/D is read out and the codeword having a bit size of 5 is removed. For maintaining 16 bits, five additional bits are supplemented into a next input data stream. The above decoding procedures are continued until all bits of the compression bit stream 360 have been recorded.

In the above embodiment, the Huffman decoding device 300 is effective for decoding the compression bit stream at an enhanced speed. The Huffman table shown in FIG. 3(b) contains only 12 Huffman codes. In practice, the Huffman table used in the industry may contain several hundreds of Huffman codes. In this circumstance, the circuitry and the hardware required for establishing the Huffman decoding device become more complicated and huge and thus the Huffman decoding device is not cost-effective.

Hereinafter, a further embodiment of a Huffman decoding device with reduced hardware and cost will be illustrated as follows with reference to FIG. 3(d).

Figure 3D:
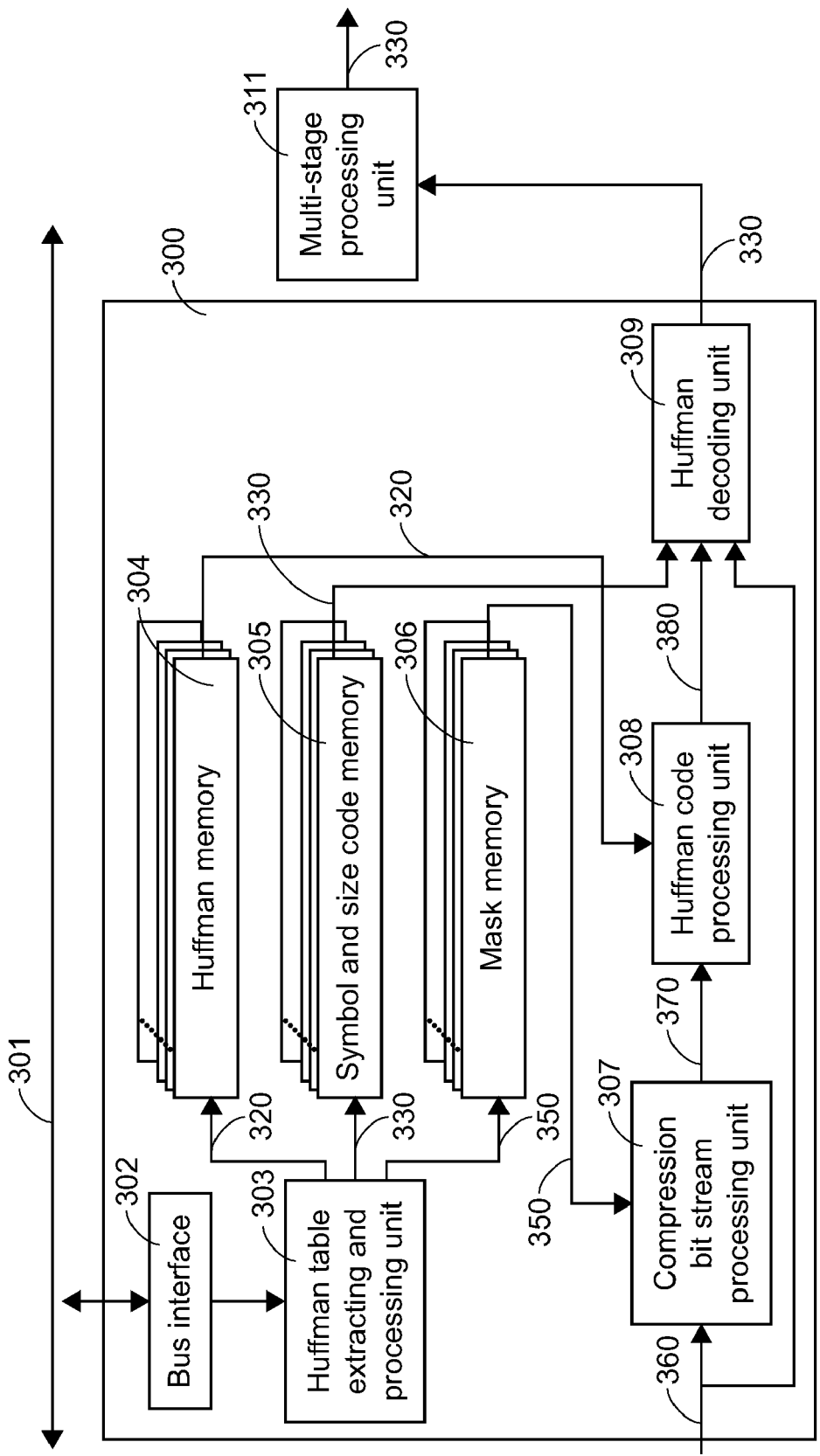
FIG. 3(d) is a schematic circuit block diagram of a Huffman decoding device according to a second preferred embodiment of the present invention.

FIG. 3(d) is a schematic circuit block diagram of a Huffman decoding device according to a second preferred embodiment of the present invention. In comparison with FIG. 3(c), a multi-stage processing unit 311 is electrically connected downstream of the Huffman decoding device 300 and the Huffman table extracting and processing unit 303 has a function of dividing the Huffman table into several groups. For example, 500 data codes 310 are transmitted to the Huffman table extracting and processing unit 303 through the bus interface 302. These data codes 310 are processed by the Huffman table extracting and processing unit 303, thereby generating corresponding Huffman codes 320, size/symbol codes 330 and mask codes 350. Moreover, during the decoding process, these 500 Huffman codes 320 which are stored in the Huffman memory 304 are divided into 5 groups such that each group contains 100 Huffman codes 320. Likewise, the size/symbol codes 330 in the symbol and size code memory 305 and the mask codes 350 in the mask memory 306 are also divided into 5 groups. In every stage, only one group of Huffman codes 320, size/symbol code 330 and mask codes 350 are processed.

Then, 16 bits of a compression bit stream 360 are successively inputted into the compression bit stream processing unit 307, and a first group of mask codes 350 are issued from the mask memory 306 to the bit stream processing unit 307. In response to the mask codes 350, the compression bit stream processing unit 307 performs masking operations on the 16-bit compression bit stream 360 and the first group of mask codes 350, thereby outputting 100 masking results 370. By the Huffman code processing unit 308, logic operations are performed on these 100 masking results 370 and the first group of Huffman code 320, thereby generating a first group of 100 new Huffman codes 380. The Huffman decoding unit 309 receives the first group of size/symbol codes 330 from the symbol and size code memory 305 and successively receives the 16 bits of the compression bit stream 360. By means of the Huffman decoding unit 309, the 16-bit compression bit stream 360 is compared with these 100 new Huffman codes 380 at a time. In a case that none of the first group of new Huffman codes 380 complies with the 16-bit compression bit stream 360, a null signal "0" is transmitted to the multi-stage processing unit 311. Subsequently, a second group of mask codes 350 are issued from the mask memory 306, and the above-mentioned masking operations and logic operations are performed to generate a second group of 100 new Huffman codes 380. In a case that none of the second group of new Huffman codes 380 complies with the 16-bit compression bit stream 360, a null signal "0" is transmitted to the multi-stage processing unit 311. The above procedures are repeated until a specific new Huffman code 380 complies with the 16-bit compression bit stream 360. Once the specific new Huffman code 380 is searched, the Huffman decoding unit 309 will transmit the corresponding size/symbol code 330 to the multi-stage processing unit 311. In the multi-stage processing unit 311, the null signals "0" and the decoded size/symbol code 330 are operated by an OR gate, thereby outputting the decoded size/symbol code 330. Similarly, the codeword having a bit size corresponding to the decoded size/symbol code 330 is removed, and identical number of bits corresponding to the removed codeword is supplemented into a next input data stream so as to maintain 16 bits. The above decoding procedures are continued until all bits of the compression bit stream 360 have been recorded.

From the second embodiment, since a group of 100 new Huffman codes participate in the data-matching procedure at one time, at most five data-matching procedures are required for processing 500 new Huffman codes. As a consequence, the overall decoding time may be extended when compared with the first embodiment of FIG. 3(c). However, since the circuitry and the hardware required for establishing the Huffman decoding device of FIG. 3(d) are simplified, the second embodiment is more cost-effective.

From the above description, the Huffman decoding method and the Huffman decoding device of the present invention are effective for implementing data matching of multiple Huffman codes. In comparison with the conventional binary tree search technique of decoding the bits of the input data stream one by one, the Huffman decoding method of the present invention may be implemented at an enhanced decoding speed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Huffman decoding method for decoding a compression bit stream into corresponding size/symbol codes, said Huffman decoding method comprising steps of:
   extracting a Huffman table comprising multiple Huffman codes and multiple corresponding size/symbol codes, wherein each Huffman code comprises a codeword having variable code length and each size/symbol code comprises a size code and a symbol code;
   generating multiple mask codes according to said size codes;
   performing masking operations on successive 16 bits of said compression bit stream and said mask codes, thereby outputting multiple masking results;
   performing logic operations on said masking results and said Huffman codes, thereby generating multiple new Huffman codes, wherein each new Huffman code includes said codeword;
   discriminating whether said 16 bits of said compression bit stream complies with a specific one of new Huffman codes; and
   outputting the size/symbol code corresponding to said codeword.

2. The Huffman decoding method according to claim 1 wherein each mask code is composed of 16 binary codes and includes a valid bit portion and an invalid bit portion, wherein the bit-size of said valid bit portion of said mask code is determined according to said size code.

3. The Huffman decoding method according to claim 2 wherein an AND gate and an OR gate are used for performing said masking operation and said logic operation, respectively, if the bit "0" indicates a valid bit and the bit "1" indicates an invalid bit.

4. The Huffman decoding method according to claim 2 wherein an OR gate and an AND gate are used for performing said masking operation and said logic operation, respectively, if the bit "1" indicates a valid bit and the bit "0" indicates an invalid bit.

5. A Huffman decoding device for decoding a compression bit stream into corresponding size/symbol codes, said Huffman decoding device comprising:
   a Huffman table extracting and processing unit for extracting a Huffman table and generating multiple mask codes, said Huffman table comprising multiple Huffman codes and multiple corresponding size/symbol codes, wherein each Huffman code comprises a codeword having variable code length, each size/symbol code includes a size code and a symbol code, and said mask codes are generated according to said size codes;
   a Huffman memory electrically connected to said Huffman table extracting and processing unit for storing said Huffman codes therein;
   a symbol and size code memory electrically connected to said Huffman table extracting and processing unit for storing said size/symbol codes therein;
   a mask memory electrically connected to said Huffman table extracting and processing unit for storing said mask codes therein;
   a compression bit stream processing unit electrically connected to said mask memory and performing masking operations on successive 16 bits of said compression bit stream and said mask codes, thereby outputting multiple masking results;
   a Huffman code processing unit communicated with said Huffman table extracting and processing unit for performing logic operations on said masking results and said Huffman codes, thereby generating multiple new Huffman codes, wherein each new Huffman code includes said codeword; and a Huffman decoding unit communicated with said Huffman table extracting and processing unit for discriminating whether said 16 bits of said compression bit stream complies with a specific one of new Huffman codes, thereby outputting the size/symbol code corresponding to said specific new Huffman code.

6. The Huffman decoding device according to claim 5 wherein each mask code is composed of 16 binary codes and includes a valid bit portion and an invalid bit portion, wherein the bit-size of said valid bit portion of said mask code is determined according to said size code.

7. The Huffman decoding device according to claim 6 wherein an AND gate and an OR gate are used for performing said masking operation and said logic operation, respectively, if the bit "0" indicates a valid bit and the bit "1" indicates an invalid bit.

8. The Huffman decoding device according to claim 6 wherein an OR gate and an AND gate are used for performing said masking operation and said logic operation, respectively, if the bit "1" indicates a valid bit and the bit "0" indicates an invalid bit.

* * * * *

UNITED STATES PATENT AND TRADEMARK OFFICE
CERTIFICATE OF CORRECTION

PATENT NO. : 7,375,660 B1  Page 1 of 1
APPLICATION NO. : 11/673379
DATED : May 20, 2008
INVENTOR(S) : Wen-Tsung Chang et al.

It is certified that error appears in the above-identified patent and that said Letters Patent is hereby corrected as shown below:

Col. 4, Line 26-58 should read
-- Referring to Fig. 3(b), an embodiment of a Huffman table used in the present invention is illustrated. As shown in Fig. 3(b), the Huffman table includes several columns such as an address column, a symbol column, a size column and a Huffman code column. The meanings of the address column, the symbol column and the size column are identical to those described in Fig. 1, and are not described redundantly herein. As previously described, the codeword column in the conventional Huffman table denotes the Huffman code of the encoded symbol. Instead of the codeword column, the preceding one or more bits of the Huffman code shown in the Huffman code column of Fig. 3(b) denotes the codeword. In other words, the codeword having variable code length is included in the 16-bit Huffman code. As a consequence, the Huffman decoder may perform the decoding operations regardless of whether the exact code length of the codeword is realized. In addition, the size code denotes bit-size of the codeword and is measure of deciding the mask code. The mask code includes a valid bit portion and an invalid bit portion. The bit-size of the valid bit portion of the mask code is determined according the size code. In this embodiment, the Huffman code includes the codeword and the valid bit portion of the mask code. The low-level bit "0" is assigned to the valid bit portion and the high-level bit "1" is assigned to the invalid bit portion. For example, the symbol A at the address "0" has a size code "1" and is assigned with a codeword "1", the Huffman code is "1000,0000,0000,000", which includes the size code "1" and the remainder 15 valid bits "0". Whereas, if the high-level bit "1" is assigned to the valid bit portion and the low-level bit "0" is assigned to the invalid bit portion, the Huffman code of the symbol A is "1111,1111,1111,~~111~~ 1111" which includes the size code "1" and the remainder 15 valid bits "1". --

Signed and Sealed this

Second Day of December, 2008

JON W. DUDAS
*Director of the United States Patent and Trademark Office*